United States Patent [19]
Yamashita et al.

[11] Patent Number: 5,294,292
[45] Date of Patent: Mar. 15, 1994

[54] PLASMA ASHING METHOD

[75] Inventors: Eiji Yamashita; Terumi Muguruma, both of Tokyo, Japan

[73] Assignee: Kabushiki Kaisha Toshiba, Kawasaki, Japan

[21] Appl. No.: 572,638

[22] Filed: Aug. 27, 1990

[30] Foreign Application Priority Data

Aug. 30, 1989 [JP] Japan .................................. 1-221687

[51] Int. Cl.⁵ .......................................... H01L 21/306
[52] U.S. Cl. ..................................... 156/643; 437/225; 437/228
[58] Field of Search .................. 437/225, 228; 156/643

[56] References Cited
U.S. PATENT DOCUMENTS 4,474,621 10/1984 Saccocio et al. ..................... 156/643

Primary Examiner—Brian E. Hearn
Assistant Examiner—Trung Dang
Attorney, Agent, or Firm—Foley & Lardner

[57] ABSTRACT

A plasma ashing method to prevent a generation of a resist-residue buildup is disclosed that includes a step for installation of a substrate on which a photoresist material is formed in a chamber, a step for drawing a vacuum in the chamber and keeping the chamber at a predetermined pressure, a step for filling oxygen gas in the camber and keeping the chamber at approximately 1 Torr, and a step for applying a high-frequency electric power of 0.10 [W/cm²] or less to the oxygen gas. A more effective range of the high-frequency electric power per area of the internal wall of the chamber is from 0.008 to 0.10 [W/cm²]. The most effective value of the high-frequency electric power is 0.055 [W/cm²].

10 Claims, 5 Drawing Sheets

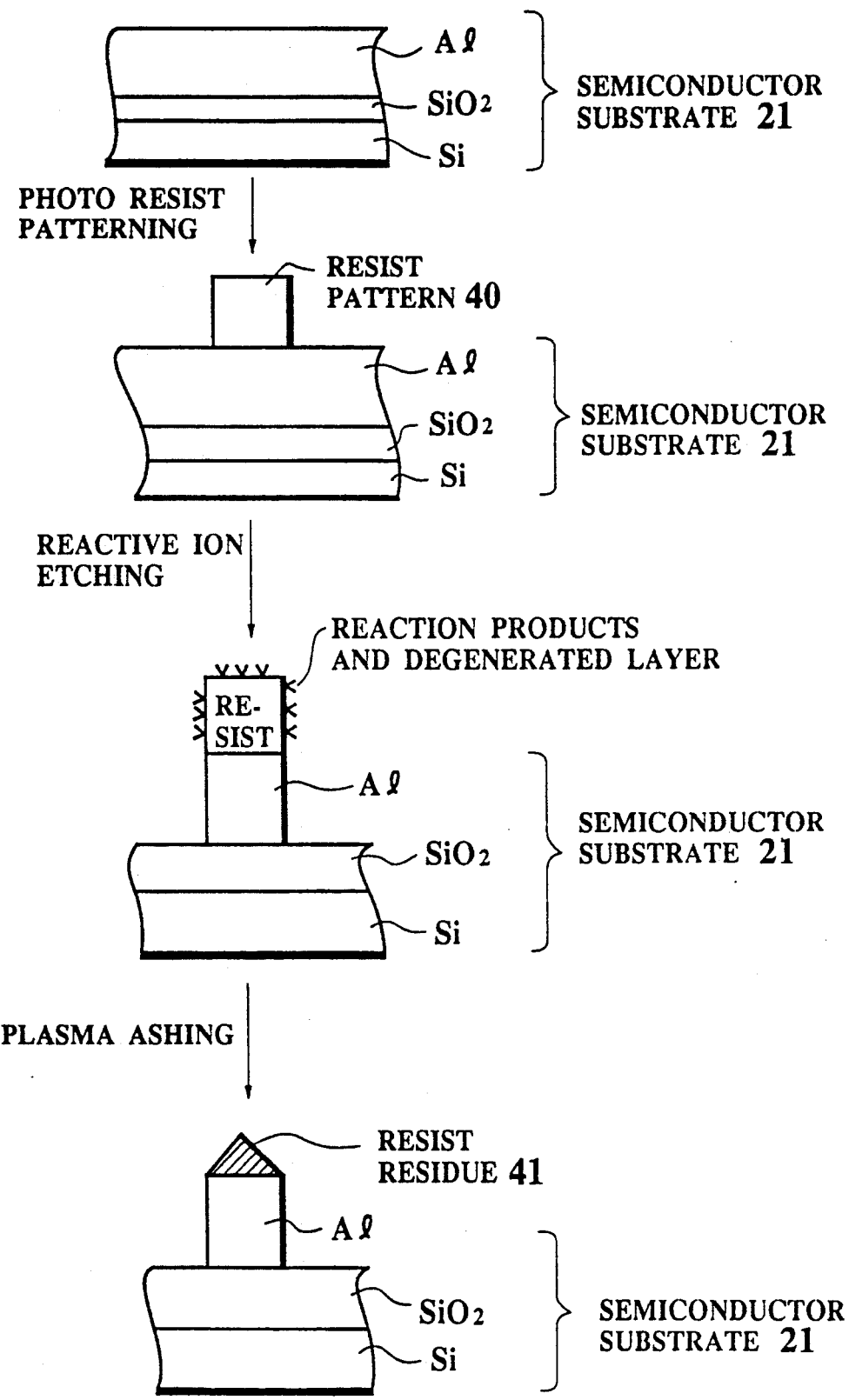

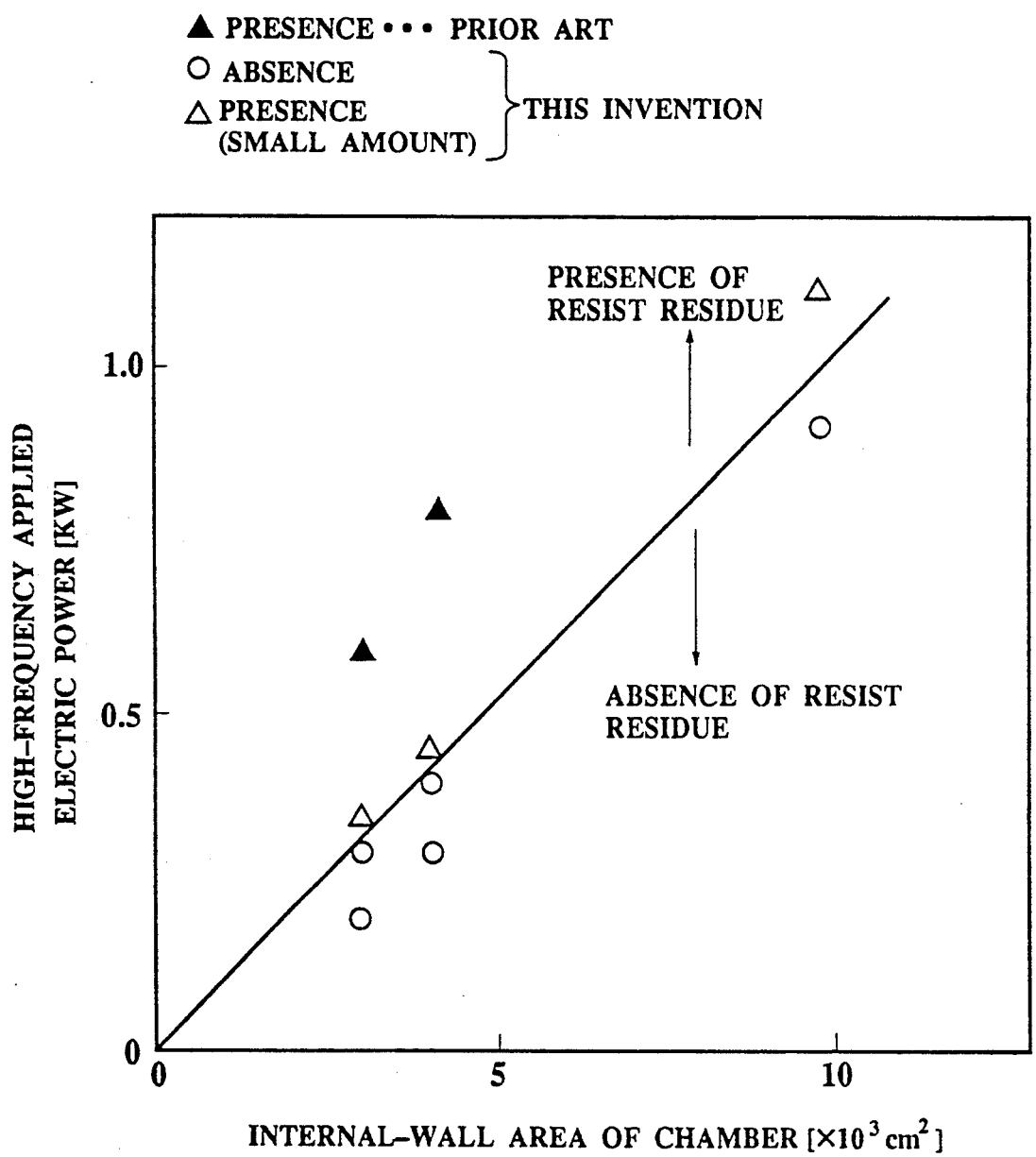

PLASMA ASHING METHOD

BACKGROUND OF THE INVENTION

1. Field of the Invention

This invention relates to a plasma ashing method used in a semiconductor fabrication process, more particularly to a plasma ashing method for control of generation of residual resist.

2. Description of the Prior Art

FIG. 1A shows mainly a cross sectional view of an inner portion of a quartz chamber in a compositional diagram of a conventional barrel-type plasma ashing device.

FIG. 1B shows a right side view of the plasma ashing device as shown in FIG. 1A. In these drawings, a reference number 21 designates a semiconductor substrate installed on quartz boat 22. A number 24 is a quartz chamber or a ceramics door to close the chamber 23. A reference number 25 denotes a vacuum pump for evacuating the chamber 23 through an exhaust pipe 28. An electrode 26 is located along the external wall of the chamber 23. The electrode 26 is connected to a high-frequency power electric source 29. A reference number 29 is an introduction pipe in order to introduce an ashing gas for a plasma ashing into the chamber 23.

Hereinafter, we will now describe steps of a plasma ashing process by using the plasma ashing device having the composition as described above.

First, the semiconductor substrate 21 on which an organic compound, for instance a photo resist pattern is formed is installed on the quartz boat 22, then placed in the chamber 23.

Next, the ceramic door 24 is closed for hermetically sealing the chamber 23. Then, the air in the chamber 23 is exhausted through the exhaust pipe 28 for keeping the chamber 23 at a predetermined high vacuum. Oxygen gas is provided into the chamber 23 through an introduction pipe 27 until the gas pressure in the chamber 23 reaches a predetermined value.

Next, the high-frequency electric power source 29 is applied to the electrode 26 to generate a plasma in the chamber 23. Thereby, the oxygen gas is excited to become active oxygen. The active oxygen reacts with the organic compound formed on the semiconductor substrate 21.

The reaction process may be expressed by the following equation.

$$C_xH_y + O^* = CO\uparrow + H_2O\uparrow + CO_2\uparrow \qquad (1)$$

where
the symbol 'O*' is the active oxygen and
the symbol '↑' denotes evaporation.

The organic compound on the semiconductor substrate 21 is removed through the above described reaction process and plasma ashing process is accomplished.

In the prior art, the voltage supplied from the high-frequency power source 27 is increased to speed up the reaction process (1). Thereby, the concentration of the active oxygen O* and the temperature in the chamber 23 become high. In addition, the reaction process is rapidly advantaged by directly heating the chamber 23 with a heater.

The condition of the plasma ashing process used in the prior art is as follows:

| PLASMA ASHING PROCESS CONDITION | | |
|---|---|---|
| | Example 1 | Example 2 |
| CHAMBER d × L [mm] | 250 × 400 | 300 × 450 |
| HIGH-FREQUENCY APPLIED POWER [W] | 600 | 800 |
| HIGH-FREQUENCY APPLIED POWER INTERNAL WALL IN CHAMBER [W/cm²] | 0.19 | 0.19 |
| ASHING RATE [Å/min] | | |
| HEATER ON | 750 | 800 |
| HEATER OFF | 500 | 600 |

In the conventional plasma ashing process as mentioned above, a bridge between resists is easily produced. The bridge is often left as a resist-residue on the semiconductor substrate 21 after the plasma ashing process is finished.

Moreover, the resist-residue is bonded so strongly on the semiconductor substrate 21 that it cannot be removed easily. It is difficult to remove adequately the resist residue 41 by a wet etching process which is performed later.

In the later processes, abnormality of the resist film deposited around the resist-residue on the substrate occurs.

Thereby, it is difficult to form a flat resist film on the semiconductor substrate. Reliability of the products fabricated by using the conventional method and productivity of the semiconductor device are degreased.

Accordingly, this is one of the factors causing the producer's price of the semiconductor device to be high.

SUMMARY OF THE INVENTION

An object of this invention is to provide a plasma ashing method that prevents generation of a resist-residue so that a semiconductor device having a high-reliability can be fabricated.

The plasma ashing method according to the present invention comprises a step for installation of a substrate on which a photoresist material is formed in a chamber, a step for drawing a vacuum in the chamber and keeping the chamber at a predetermined pressure, a step for filling a plasma ashing gas in the chamber and keeping the chamber at a predetermined pressure, and a step for applying a high-frequency electric power to the plasma ashing gas, wherein the high-frequency electric power per an area of the internal wall of the chamber is 0.10 [W/cm²] or less.

The high-frequency electric power used in the plasma ashing method of the invention is supplied under the condition of 0.10 [W/cm²] or less for the chamber or the unit area of the internal wall of the chamber. A more effective range of the high-frequency electric power per area of the internal wall of the chamber is from 0.008 to 0.10 [W/cm²]. The most effective value of the high-frequency electric power is 0.055 [W/cm²].

Accordingly, generation of a bridge buildup between resists can be prevented. Thereby a generation rate of the resist-residue can be decreased.

Therefore a required reasonable resist film can be exactly formed in a later process and a high reliability semiconductor device can be fabricated. Thereby, an improvement of productivity of the semiconductor device and a reduction in the producer's price can be now achieved.

These and other objects, features and advantages of the present invention will be more apparent from the following description of a preferred embodiment, taken in conjunction with the accompanying drawing.

BRIEF DESCRIPTION OF THE DRAWINGS

FIG. 2 shows a resist-residue buildup in steps of a plasma ashing process of a prior art.

FIG. 4A shows a generation rate of resist-residue buildup based on a relation between unit area of internal wall of the chamber and an applied high frequency electric power.

DETAILED DESCRIPTION OF THE EMBODIMENTS

Figures 1A, 1B:
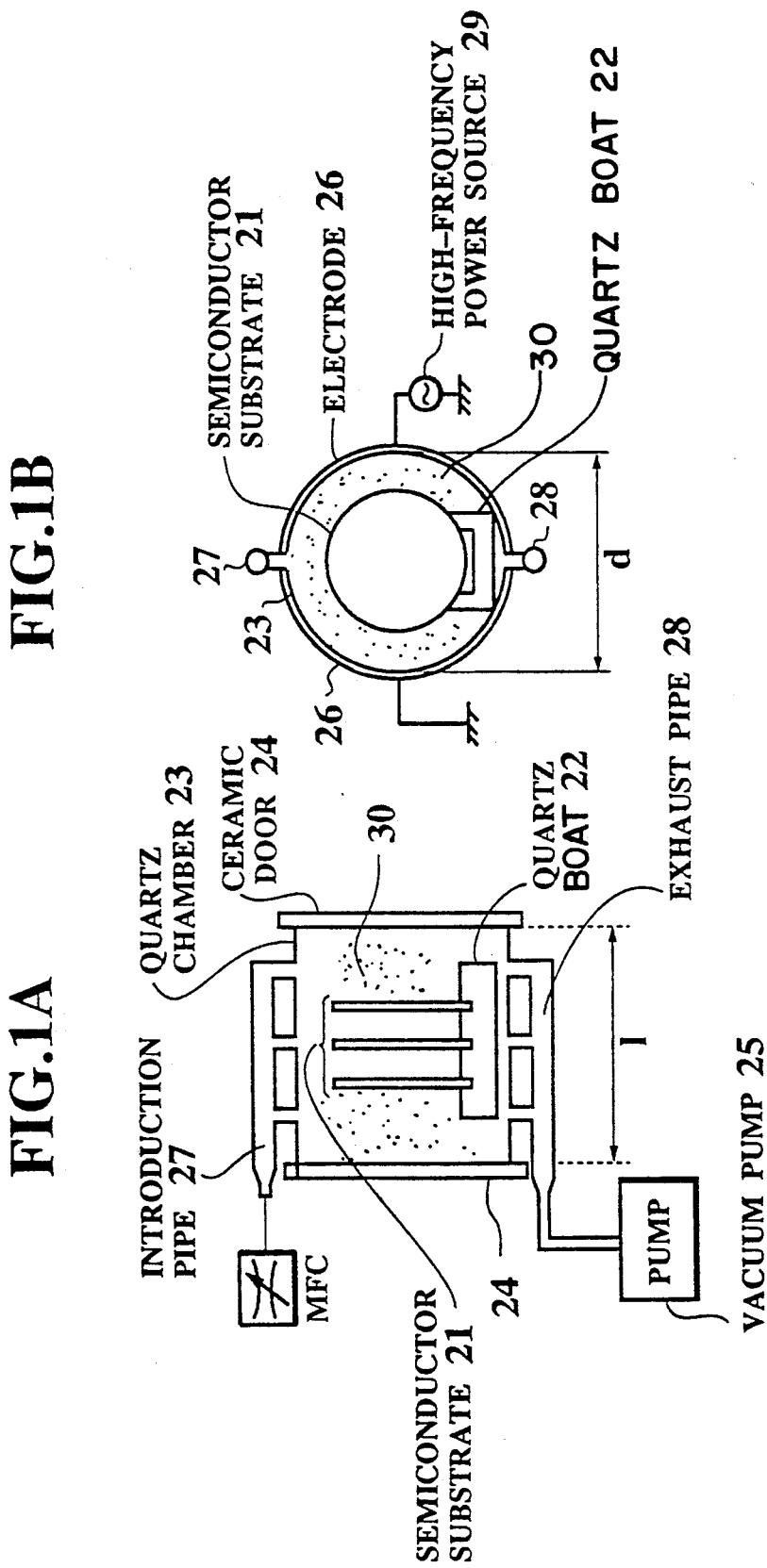
FIGS. 1A and 1B are compositional diagrams of a plasma ashing apparatus.
Figure 3:
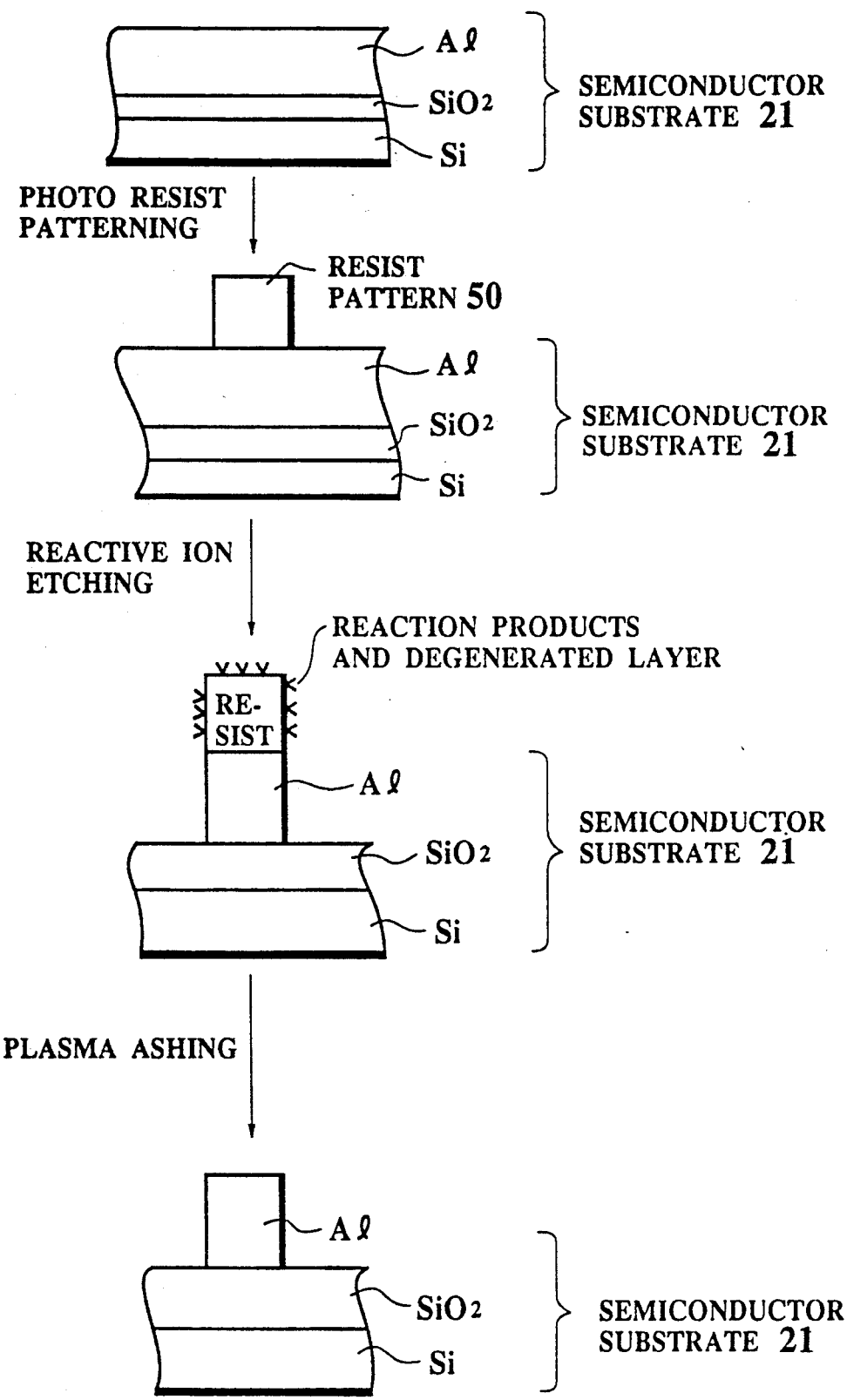
FIG. 3 shows changes of a resist formed on a semiconductor substrate in each step of the plasma ashing process of this invention.

An embodiment of the invention will now be described with reference to FIGS. 1A, 1B, 3, 4A and 4B.

A plasma ashing apparatus used in the embodiment is the same apparatus used in the description of the prior art. Consequently, an explanation of the construction of the plasma ashing apparatus Is omitted and the references numbers of the compositional elements used in the description of the prior art are also used in this embodiment.

We shall now describe an explanation of the plasma ashing method which is performed by using the plasma ashing apparatus.

First, the semiconductor device 21 was placed in quartz boat 22, then it was installed in the container or the quartz chamber 23 (a step of installation).

A resist pattern 50 was formed on the semiconductor substrate 21. The main consistent material of the resist pattern 50 was a novolak resin.

Next, the ceramic door 24 was closed so as to seal the chamber 23. The gas in the chamber 23 was drawn to a vacuum through the exhaust pipe 28, then the chamber 23 was kept at a predetermined pressure. Next oxygen gas 30 ($O_2$) as a plasma ashing gas was introduced in the chamber 23 through the introduction pipe 27. Under the control of the exhaust flow from the chamber 23 by using the vacuum pump 25, the internal pressure of the chamber 23 was kept at a pressure of 1 Torr.

When the internal pressure of the chamber 23 was approximately 1 Torr, the high-frequency electric power 29 was supplied directly to the oxygen gas 30 in the chamber 23. Thereby, in the chamber 23, the plasma ashing operation was performed (a step of plasma ashing).

After the plasma ashing procedure was performed during the predetermined time, the supply of the high electric power was cut off in order to finish the plasma ashing procedure.

In the embodiment, the plasma ashing procedure was performed in three cases, such as the following 1 to 3 cases:

| Case no. | D  L |  |
|---|---|---|
| 1. | 250 × 400, |  |
| 2. | 300 × 450, and |  |
| 3. | 450 × 700. | (unit: mm) |

Where the diameter of the chamber 23 is "D" and the body-length the chamber 23 is "L".

The number of the resist-residues on the semiconductor substrate 21 was observed with a scanning electron micrograph (SEM). The observation of the resist-residue was performed at about 23,000 magnification The observation of the number of the resist-residues was performed for areas which had an area of 5×10 ($\mu m^2$), respectively and there were five (5) observation areas per semiconductor substrate.

FIG. 4A shows a rate of a resist-residue buildup based on a relation between an unit area of the internal wall of the chamber and an applied high frequency electric power. In the diagram, the horizontal axis shows an area of an internal wall of a quartz chamber and vertical axis means a value of an applied high frequency electric power.

Figure 4B:
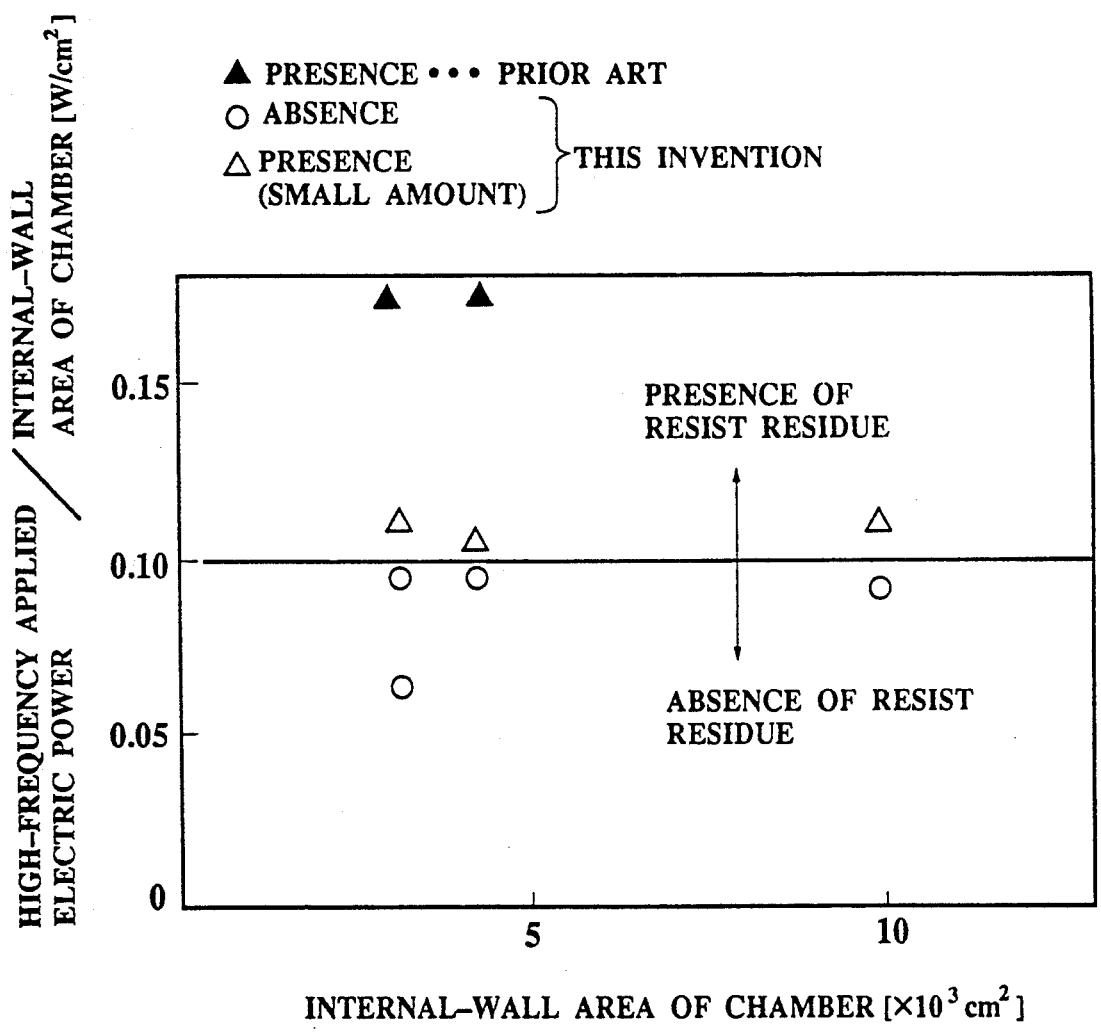
FIG. 4B shows a generation rate of resist-residue buildup based on a ratio between unit area of internal wall of the chamber and an applied high-frequency electric power.

FIG. 4B shows a rate of a resist-residue buildup based on a ratio between unit area of internal wall of the chamber and an applied high frequency electric power. In the diagram, the horizontal axis shows an area of an internal wall of a quartz chamber and vertical axis shows a ratio between unit area of the internal wall of the quartz chamber and an applied high frequency electric power.

In these diagrams, the symbol '○' designates that a resist-residue can not be observed in the plasma ashing process of the present invention. The symbol 'Δ' denotes that a resist-residue can be observed in the plasma ashing process of this invention. The symbol '▲' means that a resist-residue can be observed in the prior art. FIG. 4B is prepared by the observation result of the FIG. 4A.

Accordingly, it can be recognized that the resist residue is not produced when the plasma ashing procedure is performed under the condition (a plasma ashing condition) of 0.10 [W/cm$^2$] or less as a rate between an area of the internal wall of a chamber and an applied high-frequency electric power. The effective plasma ashing condition is from 0.008 to 0.055 [W/cm$^2$] and the most effective plasma ashing condition is 0.055 [W/cm$^2$].

In the prior art, higher electric power is applied so as to increase reaction speed of the plasma ashing process so that a resist-residue is produced on the resist pattern.

On the other hand, in this embodiment, the plasma ashing condition between the high-frequency electric power applied to the plasma ashing gas filled in the chamber and the area of the internal wall of the chamber is set at 0.1 [W/cm$^2$] or less. Thereby, a temperature of the semiconductor 21 can be kept at a lower temperature.

Therefore a generation of the resist-residue as a reaction generation material produced by the plasma ashing process can be prevented.

In this embodiment as described above, the novolak resin as the organic compound is used. But the scope of this invention is not limited to the novolak resin in the embodiment. For example, other organic compounds can also be used in order to obtain a similar effect.

Moreover, when the plasma ashing rate is changed, for example the amount of high-frequency electric power is changed, the generation of the resist-residue can be prevented so long as the rate of the plasma ashing condition is kept at 0.10 [W/cm²] or less.

Various modification will become possible for those skilled in the art after the teaching of the present disclosure without departing from the scope thereof.

What is claimed is:

1. A plasma ashing method, comprising:
   a step for installation of a substrate on which a photoresist material is formed in a chamber having an internal wall,
   a step for drawing maintaining a vacuum in the chamber,
   a step for filling a plasma ashing gas in the chamber, and
   a step for supplying a high-frequency electric power to the plasma ashing gas in the chamber,
   wherein the high-frequency electric power per area of the internal wall of the chamber is 0.10 [W/cm²] or less.

2. A plasma ashing method according to claim 1, wherein the photoresist material is a novolak resin.

3. A plasma ashing method according to claim 1, wherein oxygen gas as the plasma ashing gas is kept at 1 Torr in the step for filling the plasma ashing gas in the chamber.

4. A plasma ashing method according to clam 1, wherein the high-frequency electric power per area of the internal wall of the chamber is from 0.008 to 0.10 [W/cm²].

5. A plasma ashing method according to claim 1, wherein the high-frequency electric power per area of the internal wall of the chamber is about 0.055 [W/cm²].

6. A plasma ashing method according to claim 1, consisting essentially of the recited steps.

7. A plasma ashing method as claimed in claim 1, wherein the chamber is made of quartz with a ceramics door.

8. A plasma ashing method as claimed in claim 7, wherein the step of installing the substrate in the chamber comprises placement of the substrate in a quartz boat.

9. A plasma ashing method as claimed in claim 8, wherein the plasma ashing gas is oxygen.

10. A plasma ashing method as claimed in claim 1, wherein the plasma ashing gas is oxygen.

* * * * *